United States Patent
Weber et al.

(10) Patent No.: US 9,595,982 B2
(45) Date of Patent: Mar. 14, 2017

(54) RELAXED DIGITIZATION SYSTEM LINEARIZATION

(71) Applicant: ANALOG DEVICES, INC., Norwood, MA (US)

(72) Inventors: Theophane Weber, Brookline, MA (US); Martin Steven McCormick, Cambridge, MA (US); Qingdong Meng, Belmont, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 14/891,257

(22) PCT Filed: May 20, 2014

(86) PCT No.: PCT/US2014/038742
§ 371 (c)(1),
(2) Date: Nov. 13, 2015

(87) PCT Pub. No.: WO2014/189897
PCT Pub. Date: Nov. 27, 2014

(65) Prior Publication Data
US 2016/0094253 A1    Mar. 31, 2016

Related U.S. Application Data

(60) Provisional application No. 61/943,436, filed on Feb. 23, 2014, provisional application No. 61/825,278, filed on May 20, 2013.

(51) Int. Cl.
*H04B 1/04* (2006.01)
*H03F 1/32* (2006.01)
(Continued)

(52) U.S. Cl.
CPC ......... *H04B 1/0475* (2013.01); *H03F 1/3247* (2013.01); *H03M 1/002* (2013.01); *H03M 1/1245* (2013.01); *H04L 25/03019* (2013.01)

(58) Field of Classification Search
CPC .......................... H03M 3/358; H04B 1/0475
(Continued)

(56) References Cited

U.S. PATENT DOCUMENTS 7,151,405 B2   12/2006   Nezami
7,769,103 B2    8/2010   Carichner et al.
(Continued)

FOREIGN PATENT DOCUMENTS

CN    1615578    5/2005
EP    1983659    10/2008
(Continued)

OTHER PUBLICATIONS

Office Action and Search Report issued in Taiwan Patent Application Serial No. 101142819 mailed Jan. 27, 2016, 5 pages.
(Continued)

*Primary Examiner* — John J Lee
(74) *Attorney, Agent, or Firm* — Patent Capital Group

(57) ABSTRACT

An approach to linearization relaxes the requirements on the digitization of the analog output signal while maintaining the benefits of a high sampling rate of the output signal. The digitization approach extracts sufficient information to characterize the output signal over a wide bandwidth without necessarily determining sufficient information to fully represent the output signal, for example, without sampling the output signal at the Nyquist sampling rate with a sufficient precision to accurately represent the signal.

32 Claims, 6 Drawing Sheets

(51) Int. Cl.
H03M 1/00 (2006.01)
H03M 1/12 (2006.01)
H04L 25/03 (2006.01)

(58) Field of Classification Search
USPC .......... 455/114.3, 63.1, 501, 67.13; 341/172, 341/144
See application file for complete search history.

(56) References Cited

U.S. PATENT DOCUMENTS

| | | | |
|---|---|---|---|
| 7,899,416 | B2 | 3/2011 | McCallister et al. |
| 8,437,424 | B2 | 5/2013 | Mujica et al. |
| 2001/0050592 | A1 | 12/2001 | Wright et al. |
| 2003/0222712 | A1 | 12/2003 | Kim et al. |
| 2003/0223508 | A1 | 12/2003 | Ding et al. |
| 2004/0247042 | A1 | 12/2004 | Sahlman |
| 2004/0257157 | A1 | 12/2004 | Sahlman |
| 2004/0258176 | A1 | 12/2004 | Mattsson et al. |
| 2005/0031117 | A1 | 2/2005 | Browning et al. |
| 2005/0141637 | A1 | 6/2005 | Domokos |
| 2005/0195919 | A1 | 9/2005 | Cova |
| 2005/0212596 | A1 | 9/2005 | Batruni |
| 2005/0242876 | A1* | 11/2005 | Obernosterer ........ H03F 1/3294 330/149 |
| 2007/0005326 | A1 | 1/2007 | Koppl |
| 2007/0133713 | A1 | 6/2007 | Dalipi |
| 2008/0032642 | A1 | 2/2008 | Singerl et al. |
| 2008/0057882 | A1 | 3/2008 | Singerl et al. |
| 2008/0130789 | A1 | 6/2008 | Copeland et al. |
| 2008/0133982 | A1 | 6/2008 | Rawlins |
| 2008/0152037 | A1 | 6/2008 | Kim et al. |
| 2011/0140779 | A1 | 6/2011 | Koren et al. |
| 2011/0140942 | A1* | 6/2011 | Pagnanelli ............... H03M 3/50 341/144 |
| 2011/0204975 | A1 | 8/2011 | Miyashita |
| 2013/0120062 | A1 | 5/2013 | Lozhkin |
| 2013/0200948 | A1 | 8/2013 | Lee et al. |
| 2013/0207827 | A1* | 8/2013 | Nestler .................. H03H 15/02 341/172 |
| 2013/0243117 | A1* | 9/2013 | Jeckeln ............... H04L 27/0004 375/296 |
| 2014/0292406 | A1 | 10/2014 | Dechen et al. |
| 2015/0043678 | A1 | 2/2015 | Hammi |

FOREIGN PATENT DOCUMENTS

| | | |
|---|---|---|
| EP | 1998436 | 12/2008 |
| WO | WO 01/08297 | 2/2001 |
| WO | WO 2010/102441 | 9/2010 |
| WO | 2011/139002 | 11/2011 |
| WO | WO2013/007300 | 1/2013 |

OTHER PUBLICATIONS

English Summary of Office Action and Search Report issued in Taiwan Patent Application Serial No. 101142819 mailed Jan. 27, 2016, 3 pages.
PCT Patent Application Serial No. PCT/US2014/038742 filed May 20, 2015.
International Search Report (ISR) in PCT Application Serial No. PCT/US2014/038742 mailed May 20, 2014, 6 pages.
Written Opinion (WO) in PCT Application Serial No. PCT/US2014/038742 mailed May 20, 2014, 10 pages.
U.S. Appl. No. 13/678,904, filed Nov. 16, 2012.
1st Non-Final Office Action issued in U.S. Appl. No. 13/678,904 mailed May 11, 2015, 54 pages.
PCT Patent Application Serial No. PCT/US2012/065459 filed Nov. 16, 2012.
Office Action for EP Patent Application Serial No. 12798973.9 mailed Nov. 2, 2015, 7 pages.
Taiwan Patent Application Serial No. 101142819 filed Nov. 16, 2012.
Peng et al., "Partial Correlation Estimation by Joint Sparse Regression Models," Journal of American Statistical Association, 104 (486): 735-746 (2009).
Aschbacher et al., "Iterative linearization methods suited for digital pre-distortion of power amplifiers," Signals, Systems and Computers, Conference Record of the Thirty-Eighth Asilomar Conference on Pacific Grove, CA Nov. 7-10, 2004 pp. 2198-2202.
Rontogiannis, A.A., et al., "Distortion Countermeasures", Springer US 2007, pp. 263-311.
Tehrani, A., et al., "A Comparative Analysis of the Complexity/Accurate Tradeoff in Power Amplifier Behavorial Models,"IEEE Transactions on Microwave Theory and Techniques, vol. 58, No. 6, Jun. 2010, pp. 1510-1520.
Kim, Y. et al., "An Efficient Simplified Behavoral Model for RF Power Amplifiers," in Power Amplifiers for Wireless and Radio Applications (PAWR), 2011 IEEE Topical Conference on, pp. 65-68, IEEE, Jan. 16-19, 2011.
Tehrani, A., "Behavorial Modeling of Radio Frequency Transmitters," Thesis, Dept. of Signals and Systems, Chalmers University of Technology, Goteborg, Sweden, 2009, 55 pages.
Zhu, A., et al., "An Overview of Volterra Series Based Bahavioral Modeling of RF/Microwave Power Amplifiers", Proceedings of Wireless Microwave Technology Conference, 2006, pp. 1-5.
Nonlinear Channel Equalization With Gaussian Processes for Regression, IEEE Transactions on Signal Processing, Nov. 2008, 12 pages.
Virendra N. Mahajan, "Zernike Annular Polynominals for Imaging Systems with Annular Pupils", vol. 71, No. 1/Jan. 1981, J. Opt. Soc. Am., 11 pages.
Mark Johnson, "A Gentle Introduction to Maximum Entropy Models and Their Friends", Nov. 2007, 33 pages.
Final Office Action issued in U.S. Appl. No. 13/678,904 mailed Nov. 16, 2015, 68 pages.
Non-Final Office Action issued in U.S. Appl. No. 13/678,904 mailed May 6, 2016, 70 pages.
Office Action in CN Patent Application Serial No. 201280056330.1 mailed Mar. 31, 2016, 13 pages.
EP Search Report issued in EP-DIV Patent Application Serial No. 16150791.8 mailed Jun. 23, 2016, 10 pages.
Office Action issued in KR Patent Application Serial No. 10-2014-7016316 mailed Jun. 21, 2016, 7 pages.
Peter Singerl et al., "A Low-Rate Identification Method for Digital Predistorters Based on Volterra Kernel Interpolation", 48th Midwest Symposium on Circuits and Systems, 2005, Aug. 7, 2005 (pp. 1533-1536), IEEE.
Heinz Koeppl et al., "An Efficient Scheme for Nonlinear Modeling and Predistortion in Mixed-Signal Systems", IEEE Transaction on Circuits and Systems II: Express Briefs, Dec. 2006; 53 (12):1368-72.
Jesus Ibanez-Diaz et al., "Nonlinearity Estimation in Power Amplifiers Based on Subsampled Temporal Data", IEEE Transactions on Instrumentation and Measurement, Aug. 1, 2001; 50(4):882-7.
Final Office Action issued in U.S. Appl. No. 13/678,904 mailed Oct. 12, 2016, 72 pages.
Office Action issued in TW Patent Application Serial No. 101142819 mailed Oct. 12, 2016, 10 pages (includes EN Summary of Relevance).
Office Action in CN Patent Application Serial No. 201280056330.1 mailed Nov. 23, 2016, 15 pages (includes Summary of Relevance).

* cited by examiner

RELAXED DIGITIZATION SYSTEM LINEARIZATION

CROSS REFERENCE TO RELATED APPLICATIONS

This application is a national phase entry of PCT Application No. PCT/US2014/038742, titled "RELAXED DIGITIZATION SYSTEM LINEARIZATION," filed May 20, 2014, which claims the benefit of U.S. Provisional Application 61/825,278, titled "SPARSE SAMPLING CIRCUIT", filed on May 20, 2013, and U.S. Provisional Application 61/943,436, titled "RELAXED DIGITIZATION SYSTEM LINEARIZATION", filed on Feb. 23, 2014.

This application is also related to, but does not claim the benefit of, U.S. patent application titled "SYSTEM LINEARIZATION," published on Jun. 27, 2013, as US2013/0166259A1.

The above-referenced applications are incorporated herein by reference.

BACKGROUND

This invention relates to relaxed digitization, and more particularly, to relaxed digitization of an output of a non-linear element as part of a linearization system.

One approach to linearization of a non-linear element, for example, a power amplifier, makes use of digital samples of inputs and outputs of that element. Then, based on those samples, a predistorter is configured according to these samples such that when it is cascaded with the non-linear element it forms a combination that is linear, or at least more so than without the predistorter.

One application of such techniques addresses radio frequency power amplifiers. For example, a baseband digital signal is converted to an analog signal, modulated to a transmission frequency, and passed through a power amplifier. The output of the power amplifier is sensed and demodulated, and then converted to a digital signal. In such an approach, the modulation-amplification-demodulation path is treated as the non-linear element of the system for which the predistorter is configured. Generally, due to the non-linearity of the power amplifier, even if the input baseband signal is bandlimited, for example to 40 MHz, the bandwidth at the transmission frequency is greater than the baseband bandwidth. Not only is such expansion of the transmission band undesirable in practice, for example, due to interference with adjacent radio channels, it also results in a need to sample the output of the power amplifier at a greater bandwidth than the input signal in order to capture information that is useful or necessary in order to accurately characterize the non-linearity, and thereby be able to configure an appropriate predistorter. One approach is to use an Analog-to-Digital Converter (ADC) that samples the demodulated output signal to represent a greater bandwidth than the input. For example, in the case of a 40 MHz input bandwidth, the input baseband signal may be represented as digital (complex) values sampled at a rate 80M samples per second (i.e., 40M complex samples per second) at a sufficient precision (e.g., 12 bits). But it may be desirable or necessary to represent the output signal with a bandwidth of 200 MHz, resulting in a need to sample at a rate of 400M samples per second.

However, sampling a signal at such a high rate has a number of disadvantages, including cost and size of the circuitry required, power consumption, reliability, and/or volume of digital data that must be processed. There is a need to obtain the advantages of such sampling of the output, while avoiding or mitigating one or more of these disadvantages.

SUMMARY

In one aspect, in general, an approach to linearization relaxes the requirements on the digitization of the analog output signal (broadly referred to herein as "sampling") while maintaining the benefits of a high sampling rate and corresponding wide bandwidth of the output signal. The digitization approach extracts sufficient information to characterize the output signal over a wide bandwidth (e.g., 200 MHz) without necessarily determining sufficient information to fully represent the output signal, for example, without sampling the output signal at the Nyquist sampling rate (e.g., 400M complex samples per second) with a sufficient precision to accurately represent the signal (e.g., 12 bits). Extracting this information from the analog signal into a digital form is achievable using substantially less complex or expensive circuitry than with an Analog-to-Digital Converter (ADC) sampling at the Nyquist sampling rate and such sufficient precision.

In some implementations, the output of the relaxed digitization of the output signal is used to estimate parameters of a model of the non-linear element, for example, using least squares or other error/distortion minimization techniques, or using maximum likelihood, maximum a posteriori estimation or other statistical or probabilistic techniques. Generally, the relaxed digitization of the output is used to approximate sufficient statistics of the output signal (or of combinations of the input and output signals of the non-linear element) that are then used in the parameter estimation procedure. In some examples, these determined sufficient statistics comprise or represent estimates of the corresponding statistics that could be obtained with a full rate and precision sampling of the output.

In some examples, the model parameters of the non-linear element (i.e., a forward model) are used to determine parameters for configuring a digital predistorter (DPD) for the non-linear element. One approach is to directly transform the parameters determined from the relaxed digitization of the output signal. Another approach is, as an intermediate step, to determine a second forward model of the non-linear element using a model structure that is more amenable to "inversion" to determine the parameters of the DPD.

A number of approaches are available for the relaxed digitization of the output signal, including one (or a combination) of the following.

The output signal is sampled using analog circuitry that can capture a sample of the signal at the full output bandwidth (i.e., sample sufficiently quickly in analog form), but then only converting the analog samples to digital samples at a lower conversion rate, for example, on regular or irregular time intervals (e.g., sampling approximately every 10 samples, yielding a conversion rate of 40M samples per second rather than 400M samples per second).

Frequency subbands of the output signal are digitized separately, for example, such that in each of a succession of time intervals, one subband is digitized (e.g., sweeping through the entire output bandwidth in successive time intervals), and the digitizations of the multiple subband are used together to estimate the sufficient statistics. In some examples, the subband digitization is performed mixing the analog output signal with a oscillating signal, lowpass filtering, and digitization with a low bandwidth (e.g., 100 kHz) ADC.

An ADC with a limited precision (e.g., 4 bits) is used such that the precision of the digitization would not be sufficient to provide an accurate representation of the output signal. Although this procedure effectively introduces quantization noise into the digitized output samples, the estimates of the sufficient statistics are nevertheless useful for estimation of the model parameters.

A Delta-Sigma (ΔΣ) converter processes the continuous output signal using a decimation ratio (DR) lower than would conventionally be used to capture the full bandwidth of the output signal, for example, rather than using a decimation ratio DR=64 and 1-bit sampling (e.g., 1-bit sampling at 64×400M=25.6G samples per second), a decimation ratio of 4 is used (e.g., 1.6G 1-bit samples per second).

These are only some examples of approaches for relaxed digitization of the output signal prior to estimation of the sufficient statistics for use in model parameter estimation. Various of these and other approaches share one or more of the following common characteristics.

The digitization of the output signal provides a lower-fidelity representation (e.g., as measured by mean squared error, signal-to-noise ratio, etc.) of the output signal than the fidelity of the representation of the input signal used in estimation of the sufficient statistics.

Note that combinations of the above approaches may be used. For example, subsampling and reduced precision ADC can be combined recognizing that a higher conversion rate may be implemented at a lower precision using a fixed complexity, power, or size constraint on the conversion circuitry. As another example, a Sigma-Delta conversion approach with a relatively low decimation ratio may be applied with subband conversion. Yet other combinations are evident or would be recognized by one skilled in the art.

In another aspect, in general, a digital predistortion linearizer includes a first input for receiving an input signal representing a desired output from a plant. The desired output has a desired output bandwidth. The linearizer includes a a configurable pre-distorter for determining a driving signal representative of an input to the plant to achieve the desired output from the plant. The driving signal has a driving signal data rate (e.g., bits per second), which in some examples may be computed as being equal to product of a driving signal sampling rate (e.g., samples per second) and a driving signal precision (e.g., bits per sample). A first output provides an output signal representing the driving signal representing the input to the plant. A second input receives a sensor input signal representing an achieved output from the plant. The linearizer includes a sampler coupled to the second input to process the sensor input signal. The sampler is responsive to components of the sensor input signal outside the desired output bandwidth in a sensor bandwidth which is greater than the desired output bandwidth. The sampler provides a sampled sensor signal having a sensor signal data rate substantially smaller than the driving signal data rate. The linearizer also includes an estimator configured to accept the sampled sensor signal from the sampler and the driving signal determined by the pre-distorter, and to provide configuration data for configuring the pre-distorter.

Aspects may include one or more of the following features.

The plant comprises a radio frequency amplifier, which may be operatively coupled to the plant.

A digital to analog converter (DAC) is coupled between the pre-distorter and the first output. The output signal comprises an analog signal output from the DAC, with the DAC being configured to convert the driving signal precision to analog form at the driving signal sampling rate.

The sensor input signal comprises an analog sensor signal and the sampler comprises an analog-to-digital converter (ADC) coupled to the second input.

The ADC is configured provide digital outputs at a sensor signal sampling rate substantially lower than the driving signal sampling rate or at a sensor signal precision substantially lower than the driving signal precision, or both, thereby providing the sensor signal data rate that is substantially lower than the driving signal data rate.

The sampler comprises a sampling circuit responsive to signal components of the analog sensor signal outside the desired output bandwidth, and configured to acquire analog samples of the analog sensor signal at a sensor sampling rate insufficient to represent the sensor bandwidth The ADC is configured to convert the acquired analog samples to form the digitized sampled sensor signal, the digitized sampled sensor signal representing at least some signal components outside the desired output bandwidth.

The ADC is configured to provide digital outputs at a sensor signal precision substantially lower than the driving signal precision.

The ADC comprises a quantizer, a difference element configured to accept the analog sensor signal produce a difference between the analog sensor signal and an output of the quantizer, and filter coupled between the difference element and the quantizer providing a filter output of the difference element to the quantizer, the digitized sampled sensor signal being determined from output of the quantizer.

The sampler comprises a subband sampler configurable to quantize a subband within the sensor bandwidth, the subband having a bandwidth substantially smaller than the sensor bandwidth, and wherein ADC provides sampled sensor values at a sampling rate sufficient to represent the subband bandwidth.

The estimator is configured to use sampled sensor signals from a plurality of subbands to determine the configuration for the pre-distorter.

The linearizer is integrated into a single integrated circuit device.

The linearizer further comprising a controller and a memory for instructions and data for configuring the linearizer.

In another aspect, in general, a method for linearization of a plant includes receiving an input signal representative of a desired output from the plant. The desired output has a desired output bandwidth. A driving signal representative of an input to the plant to achieve the desired output from the plant is determined according to pre-distorter configuration data. The driving signal has a driving signal data rate, for instance, equal to a product of a driving signal sampling rate and a driving signal precision. An output signal representing the driving signal is provided to the plant. A sensor input signal representing an achieved output from the plant received and processed to determine sampled sensor dat. This processing is responsive to components of the sensor input signal outside the desired bandwidth in a sensor bandwidth greater than the desired output bandwidth. The sampled sensor data has a data rate substantially smaller than the driving signal data rate. The pre-distorter configuration data is determined from the sampled sensor data and the driving signal.

Aspects can include one or more of the following features.

Providing the output signal comprises converting the driving signal using an Digital-to-Analog Converter (DAC) at the driving signal sampling rate and the driving signal precision.

Processing the sensor input signal comprises determining digital outputs at a sensor signal sampling rate substantially lower than the driving signal sampling rate or at a sensor signal precision substantially lower than the driving signal precision, or both, thereby providing the sensor signal data rate that is substantially lower than the driving signal rate.

Determining the digital outputs comprises sampling using analog circuitry suitable for processing of the sensor signal at the sensor bandwidth and converting the sensor signal to form the digital outputs at a conversion rate lower smaller the sensor bandwidth.

Determining the digital outputs comprises in a succession to time intervals, forming the digital outputs to represent different subbands smaller than the sensor bandwidth, and wherein determining the pre-distorter configuration data comprises combining the digital outputs from a plurality of the subbands.

The sensor signal precision is smaller than one half the driving signal precision.

Determining the digital outputs comprises applying a Delta-Sigma ($\Delta\Sigma$) conversion approach to the sensor signal.

Other features and advantages of the invention are apparent from the following description, and from the claims.

DESCRIPTION

Figure 1:
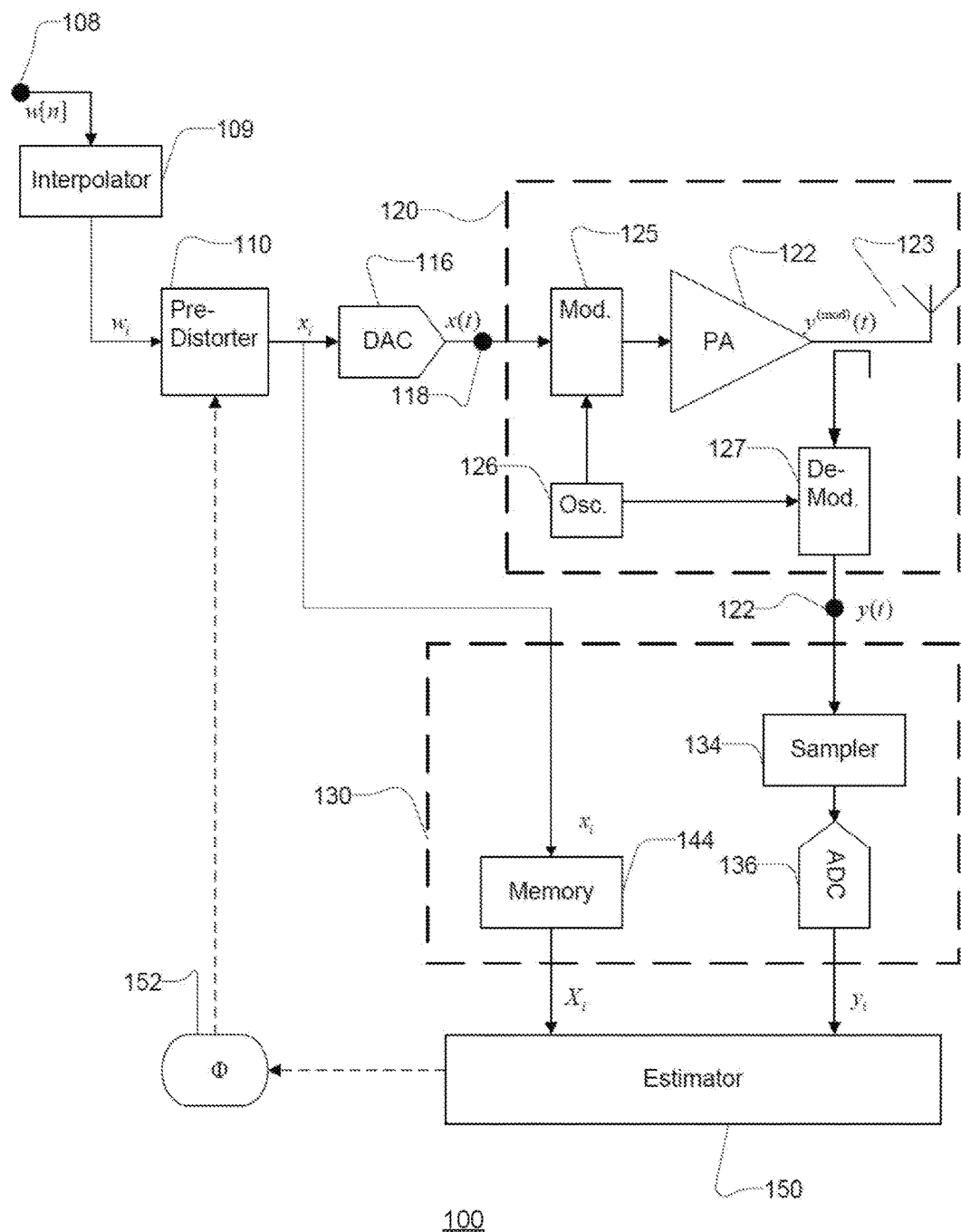
FIG. 1 is a block diagram of a linear zed power amplifier system.

Referring to FIG. 1, in one embodiment, a linearization system 100 for a radio frequency power amplifier 122 accepts at an input 108 a discrete time signal w[n] representing a desire baseband signal. In this example, the desired baseband signal has a bandwidth of 40 MHz, with the discrete time signal w[n] having complex digital sample values at a 40 MHz sampling rate. The desired signal w[n] is passed through an interpolator 109 to produce an up sampled version of the desired signal as the sequence $w_i$. This up sampled desired sequence is then passed through a digital predistorter 110 to produce an output complex discrete time signal $x_i$, generally at the same sample rate as $w_i$. The output of the predistorter 110 is passed through a Digital-to-Analog Converter (DAC) 116, which provides a continuous time signal x(t) (in practice as two real valued quadrature component signals). This signal is then modulated in a mixer 125 with the output of a local oscillator (LO) 126 to the desired radio frequency band, and passed to a power amplifier (PA) 122, which generally exhibits memorials and/or memory dependent non-linear input-output characteristics.

The output of the power amplifier 122 drives an antenna 123. The signal driving the antenna is also sensed and demodulated with a mixer 127, which is driven by the same local oscillator 126 that modulates the output of the DAC 116 producing a continuous time output signal y(t) (again in practice two quadrature real valued signals). The path from the input x(t) to the mixer 125 through to the output y(t) of the mixer 127 is treated as the nonlinear "plant" 120 than is linear zed by the system.

Note that due to the non-linear characteristics being modeled and compensated for in this approach, although the input signal w[n] may be bandlimited (e.g., sampled to represent a 40 MHz signal), it is generally important to capture characteristics of the demodulated output signal y(t) (i.e., the sensor signal) at a greater bandwidth, for example, at a multiple of that bandwidth (e.g., 5× the bandwidth to 200 MHz).

A number of different embodiments make use of the digital sampled signal $x_i$ output from the predistorter 110 as well as the continuous signal y(t) output from the "plant" 120 in order to determine parameters $\Phi$ 152 which are used to configure the predistorter 110. FIG. 1 illustrates an embodiment in which a digitizer 130 determines quantities from $x_i$ and y(t), which are passed to an estimator 150, which estimates parameters $\Phi$.

In one embodiment following FIG. 1, the input signal $x_i$ and output signal y(t) are monitored during a sensing period, for example, of duration 1.0 seconds. These sensing periods are repeated, for example, with the estimator processing the samples from one sensing period while collecting the samples for the next sensing period. In this embodiment, during a sampling period a sampler 134 coupled to an analog-to-digital converter (ADC) 136 digitizes the output signal at a full rate and digital precision (e.g., 14 bits), for example, at 800M 14-bit values per second as 400M complex values $y_i$ per second (thereby satisfying the Nyquist sampling criterion). During that same period a memory element 144 maintains a memory of past values of $x_i$ and outputs a (T+1)-vector $X_i=(x_i, x_{i-1}, \ldots x_{i-T})$ for value $x_i$.

In this example, and generally in many of the examples described below, a non-linear model of the plant 120, which includes the power amplifier 122, has the form $$y_m = \sum_{s=1}^{S} a_s \varphi_s(X_m)$$

where S is the number of non-linear terms and $X_m=(x_m, x_{m-1}, \ldots x_{m-T+1})$ are input values in a trailing window prior to $x_m$. For example, each function $\varphi_s(X_m)$ has the form $$\varphi_s(X_m)=|x_{m-d}|^k x_{m-d}$$

where the lag $0 \leq d \leq T$ and exponent $0 \leq k \leq N$ depend on the component s.

The parameters that characterize the input/output characteristics of the power amplifier are arranged as an S element column vector $$\underline{a}=[a_1 \ldots a_S]^T$$

In discussion below, an estimate of these parameter values is denoted $\Phi=\{\hat{a}_i\}$.

In this full rate and precision sampling, an M-element column vector of output values is formed $$\underline{y}=[y_1 \ldots y_M]^T$$

and S separate M-element column vectors, with corresponding input values, are formed as $$\underline{\phi}_s(X) = [\phi_s(X_1) \ldots \phi_s(X_M)]^T.$$

The model can then be represented as $$\underline{y} = \phi(X)\underline{a}$$

where the M×S matrix $\Phi(X)$ is formed as $\phi(X) = [\phi_1(X) \ldots \phi_S(X)]$.

A minimum mean square error estimate of the parameters $\underline{a}$ is then determined as $$\underline{\hat{a}} = (\phi(X)^T \phi(X))^{-1}(\phi(X)^T \underline{y})$$

Therefore, the sufficient statistics needed for determining the estimated parameters are $$\alpha_{ij} = \varphi_i(X)^T \varphi_j(X) = \sum_{m=1}^{M} \varphi_i(X_m)\varphi_j(X_m)$$

and $$\beta_i = \varphi_i(X)^T \underline{y} = \sum_{m=1}^{M} \varphi_i(X_m) y_m$$

for all $1 \le i, j \le S$. The overall process to determine $\Phi = \{\hat{a}_s\}$ therefore involves digitizing the output values $y_i$ from the output signal y(t) and using outputs $x_i$ of the predistorter 110 (which are at the up sampled rate produced by the interpolator 109), then computing the sufficient statistics and forming the result as $$\underline{\hat{a}} = [\alpha_{ij}]^{-1}[\beta_i],$$

which is a product of an S×S matrix times an S vector.

It should be understood that the matrix/vector representation of the computation involved can be modified to achieve the same result, and therefore implementations of the approach are not limited to this specific formulation.

Note that the example described above, M successive samples $y_i$ (where the subscript i=1 corresponds to the start of the estimation interval and i=M corresponds to the last sample of the estimation interval), where the successive samples are sampled by the sampler 134 at successive time samples at the full sampling rate (e.g., 400M samples per second). Therefore, the time between successive samples is one over the sampling rate (e.g. 1/400M=2.5 nanoseconds). The successive samples are then used are used to form a vector $\underline{y} = [y_1 \ldots y_M]^T$, which combined with $\underline{\phi}_s(X) = [\phi_s(X_1) \ldots \phi_s(X_M)]^T$ are used by the estimator 150. In some implementations, the estimator first accumulates the sufficient statistics $\alpha_{ij}$ and $\beta_i$ as outlined above, and then computes the parameter estimates $\underline{\hat{a}}$ A number of the relaxed digitization approaches can be understood as forming approximations of (or probabilistic expectations of) sufficient statistics that are used by alternative version of the estimator 150.

In one alternative, the digitizer 130 does not sample the output y(t) at successive samples at the full sampling rate. Rather than sample at sample times $\{1, 2, \ldots, M\}$ of an estimation interval, the sampler 134 samples the output y(t) at a set of times $T = \{\tau1, \tau2, \ldots, \tau M\}$. By spacing the sample times, the analog-to-digital converter 136 does not have to perform conversions at the full sampling rate (e.g., 400M conversion per second), as long as the sampler 134 samples the output y(t) without introducing a substantial lowpass filtering (e.g., by not averaging y(t) over more than 2.5 nanoseconds). The output vector is then formed as $\underline{y} = [y_{\tau 1} \ldots y_{\tau M}]^T$.

Although non-consecutive samples of the output y(t) are used, consecutive values $x_i$ for each of the sample times $\tau m$ are used in the trailing history of the input to the plant formed as $X_{\tau m} = (x_{\tau m}, x_{\tau m-1}, \ldots x_{\tau m-T+1})$, and the quantities $\underline{\phi}_s(X) = [\phi_s(X_{\tau 1}) \ldots \phi_s(X_{\tau M})]^T$ are used by the estimator. However, consecutive values of $x\_i$ are available without any analog-to-digital conversion, and therefore us a high sampling rate does not incur the disadvantages sampling the output y(t) at that same high rate.

Using this sparse sampling of the output, the statistics used to estimate the parameters of the plant are computed essentially using the same approach as in the consecutive sampling case as $$\alpha_{ij} = \sum_{m=1}^{M} \varphi_i(X_{\tau m})\varphi_j(X_{\tau m})$$

and $$\beta_i = \sum_{m=1}^{M} \varphi_i(X_{\tau m}) y_{\tau m}.$$

In some examples, the sample times are regularly spaced in time (e.g., every $10^{th}$ sample time, or ever 25 nanoseconds), although such regular spacing is not necessarily required. In general, the sample times are chosen such that the estimates $\underline{\hat{a}} = [\alpha_{ij}]^{-1}[\beta_i]$, are unbiased.

In another alternative, which may be applied to either sampling the output at the full sampling rate or applied to sampling at the regularly or irregularly spaced subsamples as described above, the output signal is converted to digital form by the analog-to-digital converter 136 are a substantially reduced precision. For example, rather than conversion with a precision of 14 bits per quantity, 4 bits or precision may be used (i.e., the most significant 4 bits). These digitized samples may be considered to represent an additive error $$\tilde{y}_m = y_m + e_m$$

where $e_m$ is the quantization error. In this approach, the quantities $\alpha_{ij}$ are computed as described above, because the reduced precision conversion does not affect the interpolation of the input. However, the statistic $\beta_i$ is computed as $$\tilde{\beta}_i = \Sigma_m \phi_i(X_m) \tilde{y}_m = \beta_i + \Sigma_m \phi_i(X_m) e_m.$$

To the extent that the terms $e_m$ are uncorrelated with the corresponding terms $\phi_s(X_m)$, the error in the estimate has a zero expected value. Therefore, the estimate $$\underline{\hat{a}} = [\alpha_{ij}]^{-1}[\tilde{\beta}_i]$$

is unbiased.

Figure 2:
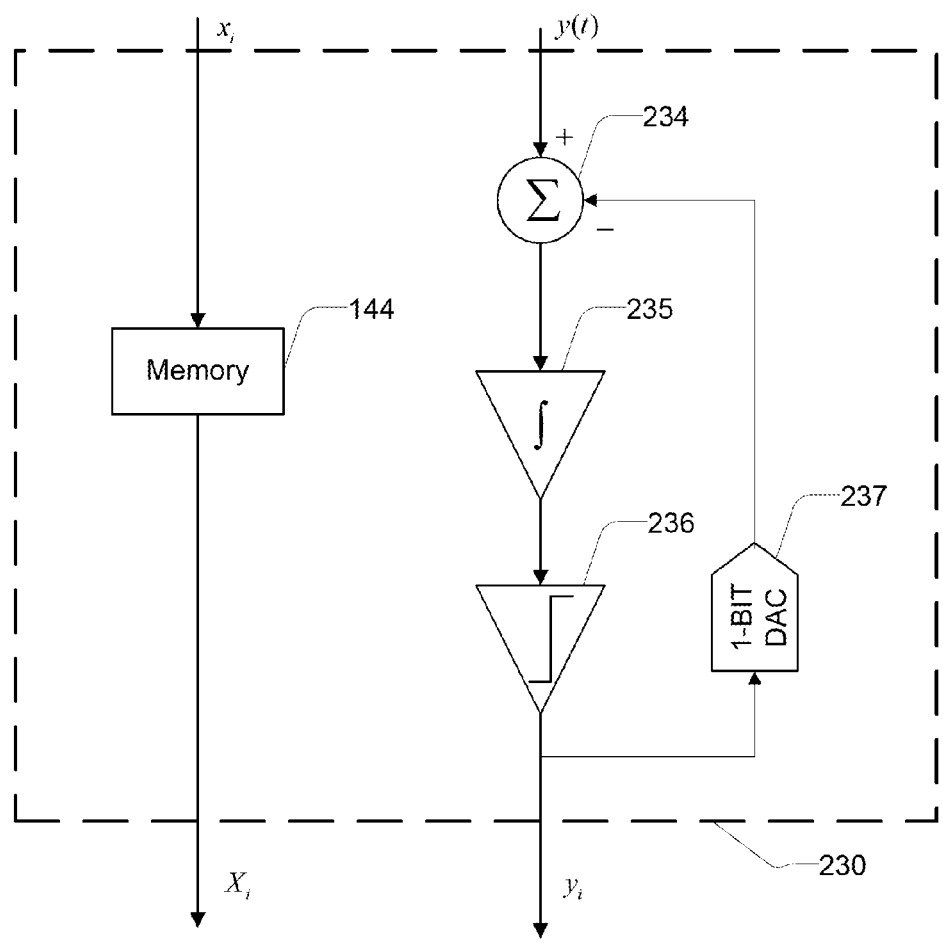
FIG. 2 is a block diagram of an delta-sigma based digitization approach.

In a further embodiment, the output y(t) of the mixer 127 is digitized using a "relaxed" delta-sigma ($\Delta\Sigma$) converter with little or no decimation. Referring to FIG. 2, a digitizer 230 uses a delta-sigma approach to digitize the output y(t). The output y(t) passes through a summer 234 that sums the current output y(t) and an 1-bit digital-to-analog conversion (in DAC 237) of the current output $y_i$. The output of the summer is integrated in an integrator 235, and then passed through a quantizer 236 clocked at the sampling output sampling rate (e.g., 400M or higher samples per second), which produces a 1-bit output $y_{i+1}$. Note that although illustrated as a 1-bit quantizer and feedback path, the quantizer 236 may also be an n-bit ADC (e.g., 4-bit ADC) and the feedback provide an n-bit DAC.

Conventionally in a delta-sigma converter, the output sequence $y_i$ is passed through a low-pass filter in order to remove quantization noise, which is shaped by the sampling process to be found at high frequencies. This shaped quantization noise is relatively benign as it is uncorrelated with the signal (even more-so than the reduced-precision ADC) and occupies higher frequencies. In the approaches above to computing the sufficient statistics, the high-frequency quantization error in $y_i$ may be ignored (or alternatively filtered using a relatively simple digital filter, which is not shown in FIG. 2). The statistics $$\beta_i = \sum_{m=1}^{M} \varphi_i(X_m) y_m$$

are then computed using the 1-bit (or alternatively n-bit) quantities $y_i$ that are output from digitizer.

The approach shown in FIG. 2 has the additional benefit that the multiplier hardware for computing the terms $\beta_i$ are simplified because the output of the digitizer 230 consists of a small range of numbers (e.g., −1 and 1). In one embodiment, a low-order continuous-time sigma-delta modulator (which does not require a sample-and-hold) is operated at an oversampled rate equal to the transmit data rate, rather than a larger multiple of it as a traditional design would dictate.

In another alternative that relaxes the requirement that the output y(t) is digitized at a full data rate, different relatively narrow frequency subbands of y(t) are analyzed in sequence, and data accumulated at the different frequency bands is combined for form the estimates of the plant parameters.

Figure 3:
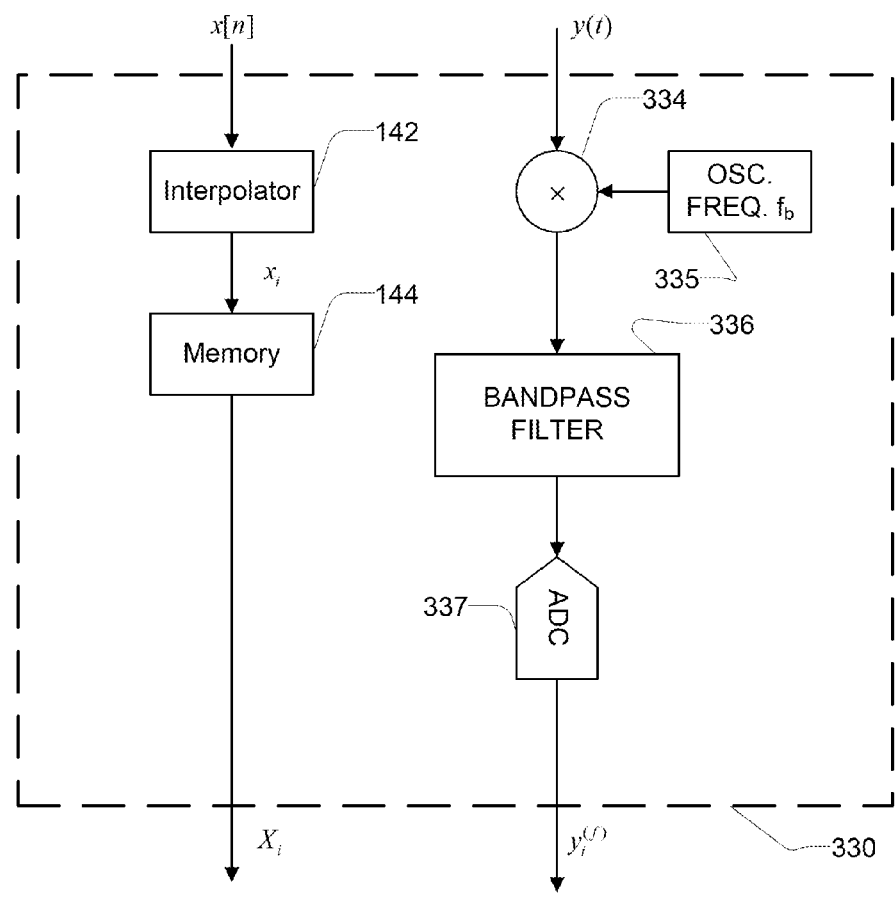
FIG. 3 is a block diagram of a subband sampling approach.

Referring to FIG. 3, the output y(t) is modulated using a multiplier 334 and an oscillator tuned to a frequency $f_b$ to bring a subband of interest new zero frequency. This modulated signal is passed through a bandpass filter 336, and digitized analog-to-digital converter 337. Note that the required sampling rate of the ADC 337 is governed by the bandwidth of the bandpass filter 336. Therefore if the passband of the bandpass filter is a factor of K smaller than the full bandwidth of the output signal y(t) being analyzed, then a factor of 1/K fewer samples per second are needed (e.g., if 10% of the bandwidth is passed through the bandpass filter, rather than having to sample at 400M samples per second, only 40M samples per second are needed). Note that the band pass filter 336 is easier to implement after modulation due to the decreased Q factor. An ADC 337 accurately acquires the subband data.

When output y(t) is sampled at the full bandwidth, as described above the parameters $\hat{a}_s$ are chosen such that $$\|\underline{y} - \underline{\hat{y}}\|^2 = \|\underline{y} - \varphi(X)\hat{a}\|^2 = \sum_{m=1}^{M}(y_m - \hat{y}_m)^2 = \sum_{m=1}^{M}\left(y_m - \sum_{s=1}^{S}\hat{a}_s \varphi_s(X_m)\right)^2$$

is minimized. This quadratic form may be optimized by computing $$\underline{\hat{a}} = (\phi(X)^T \phi(X))^{-1}(\phi(X)^T \underline{y}).$$

The general approach to use of the subband sampling approach is to perform the minimization in the frequency domain recognizing that $$\sum_{m=1}^{M}(y_m - \hat{y}_m)^2 = \sum_{f}((F\underline{y})_f - (F\underline{\hat{y}})_f)^2$$

where $(F\underline{y})_f$ is the f frequency component of the Fourier transform $F\underline{y}$ of sequence $\underline{y} = (y_1, \ldots, y_m, \ldots, y_M)$.

Therefore, the minimization may be performed after Fourier Transform by defining $\underline{z} = F\underline{y}$ and $\psi(X) = [F\phi_1(X) \ldots F\phi_S(X)]$. Note that the Fourier Transform of the M element vector of complex entries is also represented as a vector of M complex entries, and may be computed, for example, using a Fast Fourier Transform (FFT). The estimate of the parameters are then computed in the frequency domain as $$\underline{\hat{a}} = (\psi(X)^T \psi(X))^{-1}(\psi(X)^T \underline{z}).$$

or equivalently $$\alpha_{ij} = \psi_i(X)^T \psi_j(X) = \sum_{f=1}^{M}[\psi_i(X)]_f [\psi_j(X)]_f$$

and $$\beta_i = \psi_i(X)^T \underline{z} = \sum_{f=1}^{M}[\psi_i(X)]_f z_f$$

with $$\underline{\hat{a}} = [\alpha_{ij}]^{-1}[\beta_i]$$

as before.

In this approach, a frequency weighting is optionally introduced by using a non-negative real scaling $w_f$ in each of the summations over frequency above.

In the sub-band analysis approach, multiple windows of data are considered.

If B windows (e.g., parts of a sampling period) of data $\underline{y}^{(1)}, \ldots, \underline{y}^{(B)}$ and corresponding $\underline{X}^{(1)}, \ldots, \underline{X}^{(B)}$ are collected, in general each with a different frequency weighting $\underline{c}^{(b)}$, then the estimates of the sufficient statistics can be computed as $$\alpha_{ij} = \sum_{b=1}^{B}\sum_{f=1}^{M}c_f^{(b)}[\psi_i(X^{(b)})]_f [\psi_j(X^{(b)})]_f$$

and $$\beta_i = \sum_{b=1}^{B}\sum_{f=1}^{M}c_f^{(b)}[\psi_i(X^{(b)})]_f z_f^{(b)}$$

In the subband approach introduced above with reference to FIG. 3, during for each subband iteration $b=1, \ldots, B$, essentially a subset of M/K of the entries of $\underline{z}^{(b)} = F\underline{y}^{(b)}$ near the the analysis frequency $f_b$ are determined and the other entries are treated as unknown (e.g., because they were discarded by the bandpass filter). Therefore the frequencies outside the range of known values of $\underline{z}^{(b)}$ can be omitted from the summations (or equivalently viewed as setting entries of $\underline{c}^{(b)}$ to zero for the frequencies outside the known range).

Returning now to the configuration of the predistorter 110 given the estimate of the parameters $\Phi = \{\hat{a}_s\}$. Recall that the predictor has the form $$\hat{y}_m = \sum_{s=1}^{S} \hat{a}_s \varphi_s(X_m)$$

where $$\varphi_s(X_m) = |x_{m-d}|^k x_{m-d}$$

One approach to configuring the predistorter 110 is to estimate an alternative predictor $$\hat{y}_m = \sum_{s=1}^{S} \hat{b}_s \varphi_s(\hat{Y}_{m-1}) + \sum_{k} \hat{c}_k |x_m|^{k-1} x_m$$

by finding parameters $\Theta = \{\hat{b}_s, \hat{c}_k\}$ such that the function best approximates the predictor based on the parameters $\Phi = \{\hat{a}_s\}$, for example, by using the record of past values $x_m$ and the predicted values $\hat{y}_m$ from $X_m$ using $\Phi = \{\hat{a}_s\}$. Therefore the desired predistorter output $x_m$ at time m is determined to find $\hat{y}_m = w_m$ by $$f(x_m) = \sum_{k} \hat{c}_k |x_m|^{k-1} x_m = w_m - \sum_{s=1}^{S} \hat{b}_s \varphi_s(\hat{Y}_{m-1})$$

The function $f(x)$ is inverted by first finding $|x_m|$ and the determining the phase of the complex input $x_m$.

Returning to the approach of time subsampling described above with reference to FIG. 1, generally, the continuous-time demodulated output of the power amplifier 122, y(t), is sampled sparsely to determine parameters Φ152, which control operation of the predistorer. The estimator 150 determines sparsely sampled times τ1, τ2, etc. at which the demodulated output of the power amplifier is to be sampled as $y_{\tau 1}$, $y_{\tau 2}$ etc. by the sampling circuit 130 and passes them via connection 156 to the sampling circuit. In some examples, these times are determined in the sampling circuit rather than by the estimator, or are determined implicitly according to a regular pattern (e.g., periodic with a known offset from the input). The estimator uses the sparsely sampled outputs in conjunction with the known inputs of the power amplifier $x_1, x_2, \ldots, x_t$ to estimate the parameters Φ. Note that depending on the estimation technique and the model structure, all samples $x_1, x_2, \ldots, x_t$ are not necessarily required. For example, bursts of inputs in the vicinity of a sampled output may be sufficient to estimate the model parameters.

Figure 4:
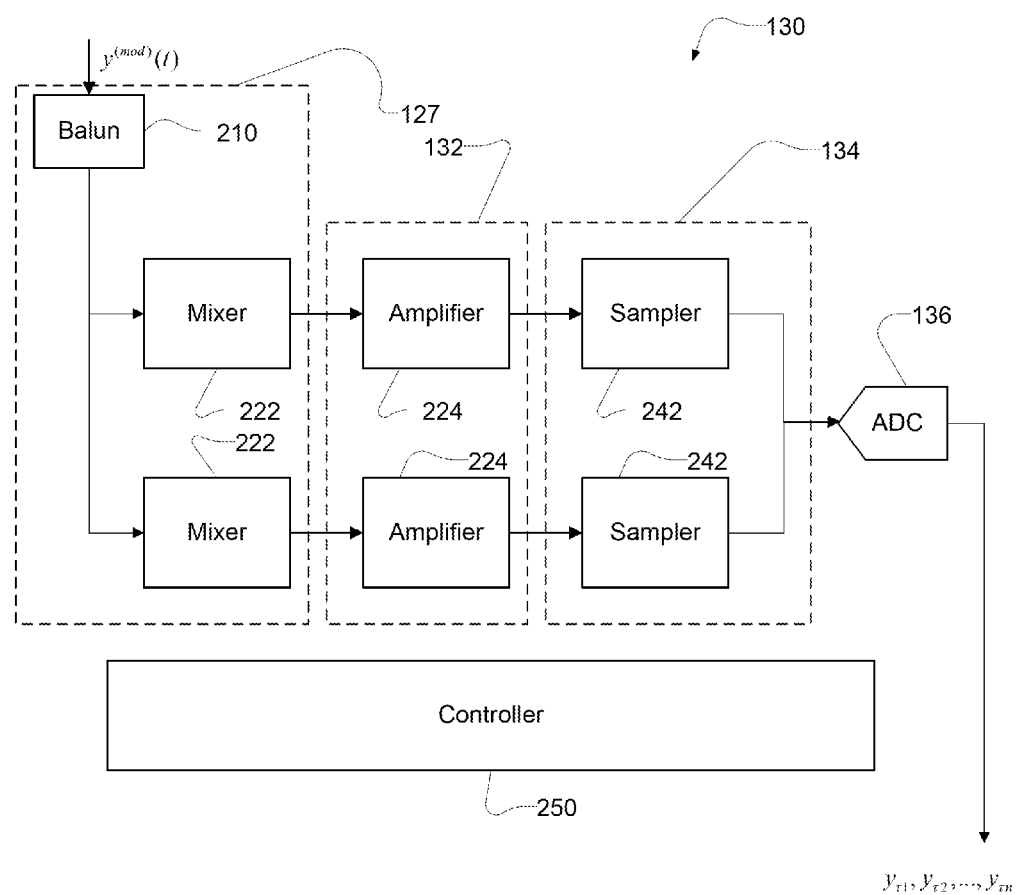
FIG. 4 is a block diagram of an output sampling circuit.

Referring to FIG. 4, a block diagram of an implementation of the demodulator 127 and output sampling circuit 130 includes a balun 210, which outputs a differential signal representing the output of the power amplifier. This differential signal is passed to a pair of mixers 222, which demodulate the output of the power amplifier to its two quadrature components. Each component is passed through a broadband (e.g., 250 MHz) amplifier 224, whose output passes to a corresponding sampler 242. The analog to digital converter (ADC) 136 is used to convert outputs of the sampler to digital form for passing to the estimator 150 shown in FIG. 1. As a result of the reduced rate sampling, one ADC can be shared among the multiple components (i.e., quadrature components) of the signal. Note that in other examples it is not essential to have two separate quadrature paths when the desired input represents a real signal. Note also that the mixers 222 do not necessarily have to demodulate the output signal to a baseband. For example, the mixers may demodulate to an intermediate frequency, and the amplifier may suitably bandlimit the signal so that the sampler samples an aliased signal.

Figure 5A:
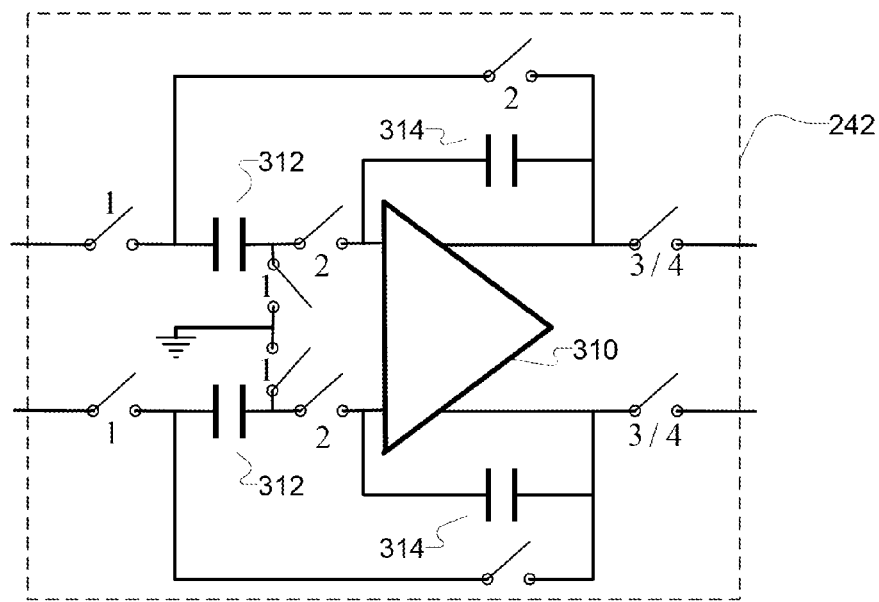
FIGS. 5A-B are schematics of two examples of a sampler.
Figure 5B:
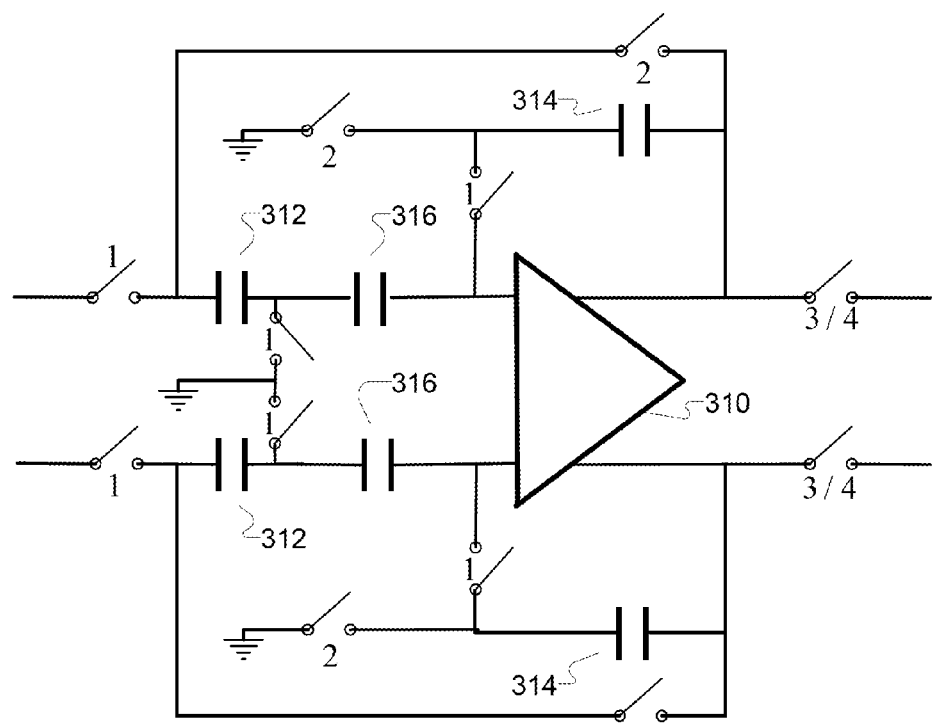
Figure 6:
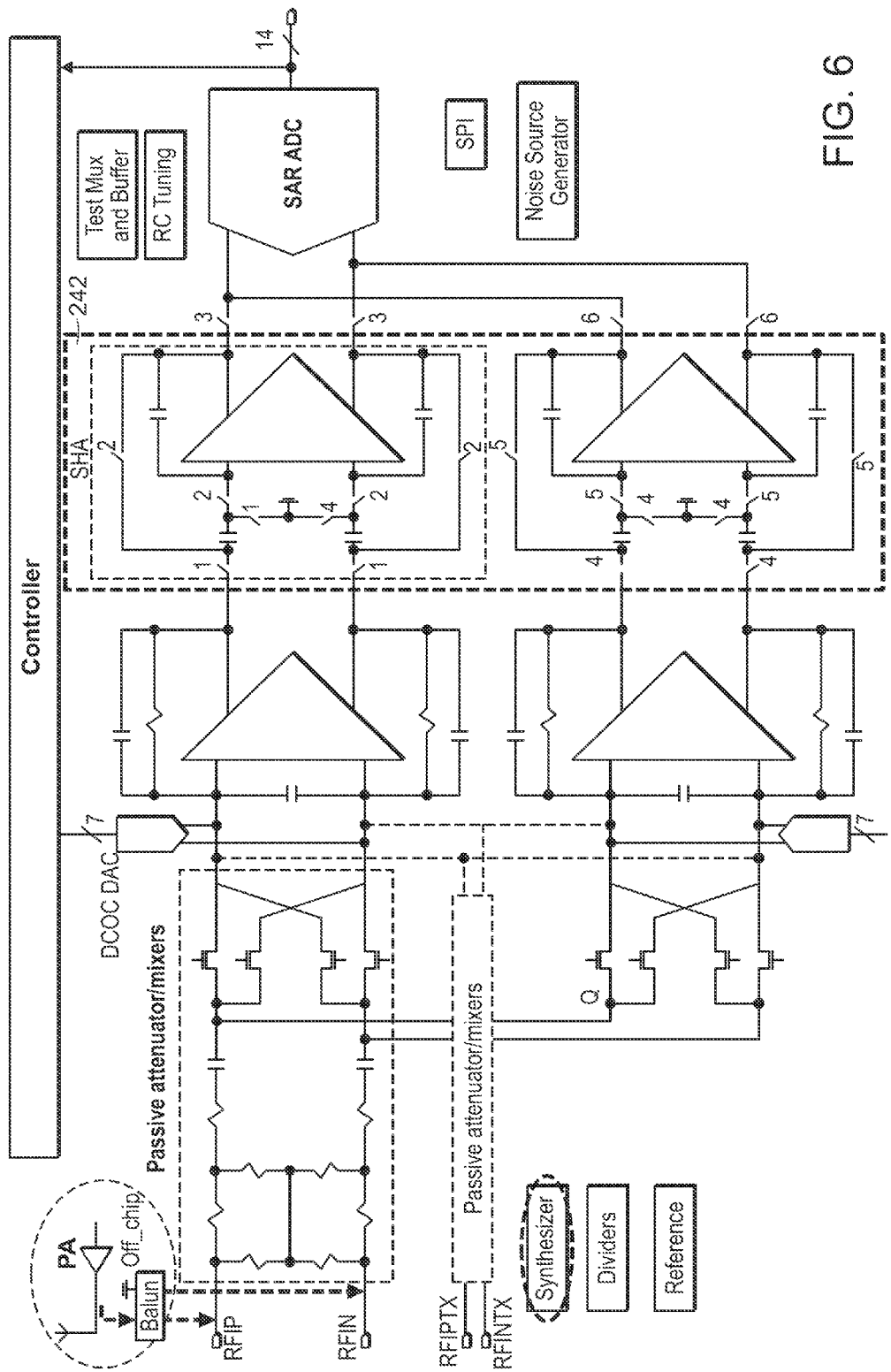
FIG. 6 is a schematic of an output sampling circuit.

Referring to FIG. 5A, an implementation of a sampler uses a charge transfer configuration with a differential operational amplifier 310. Operation of the sampler can be understood as follows. In a first phase, the switches indicated as "1" are closed to sample the output of the amplifier 224. During this phase, the charge on the two capacitors 312 at the input to the amplifier charge fully to the input voltage. In an example where the output of the broadband amplifier 224 is 100 MHz, the sampling time is chosen to be 2 ns, thereby avoiding substantial time averaging of the signal. Note that sampling every 2 ns would be sufficient to sample a full bandwidth signal of 250 MHz at the Nyquist rate. However in this design, the first phase is repeated at a relatively slow rate, for example, once every 25 ns (i.e., at 40 MHz). Note that both samplers 242 sample the quadrature components at the same time. During the time between samples (e.g., during the 23 ns between sampling times) three further phases are used. During a second phase the switches indicated as "2" are closed. This causes the charge on the feedback capacitors 314 to be charged to the same voltage as the input capacitors 312. The second phase for the two samplers 242 can occur concurrently but are not required to do so. In a third phase, the switch indicated "¾" of one of the two samplers is closed so that the output signal is passed to the ADC 136, which performs a conversion to a digital representation of the amplifier output. In a fourth phase, the switch indicated "¾" of other of the two samplers is closed so that the output signal is passed to the ADC 136. In this manner, assuming that the signal is sampled approximately once every 25 ns, the ADC needs a conversion time of approximately 12.5 ns (or somewhat less to allow setting in phases 1 and 2). In some examples, the ADC uses a successive approximation approach to conversion of the sampled amplifier output. Referring to FIG. 3B, an alternative implementation of the sampler uses a correlated double sampling technique. The added capacitors 316 provide a compensation for correlated errors (e.g., DC offset and low frequency noise) in the output between phases 1 and 2. A full schematic of the sampling circuit 130 is shown in FIG. 6.

In alternative embodiments, the approach does not require a modulator 125 and demodulator 127 in the plant. For example, the desired input may already represent a modulated signal and therefore not require further modulation. As another example, the sensed output of the power amplifier may not be demodulated, and the sampling circuit then performs a direct conversion of the sensed signal. In other examples, the demodulator may partially demodulate to an intermediate frequency, and the sampling circuit samples this intermediate frequency signal.

In some implementations, all the components shown in FIG. 1, other than the plant 120, are integrated into a single device, which as an input terminal 108 for the digital desired output (in digital, or alternatively in analog form digitized internally to the device), and analog terminals 118 and 122, which provide the analog output and input of the sensed output of the plant, respectively. Operation of the device may be controlled by an internal controller (not shown in FIG. 1), for example, one or more programmable controllers, general purpose processors, digital signal processors, etc., that executes instructions stored in a memory in the device. Data and/or instructions in the memory effectively configure the device to perform a particular version of the sparse filtering and predistortion approach described above.

In particular, the same hardware implementation of the system shown in FIG. 1 may be configured to perform different forms of sparse filtering, different structures of predictor functions, etc. by changing the configuration data and/or instructions in the memory used by the controller.

In some implementations, the elements shown in FIG. 1 may be split into multiple devices, for example, by separating the estimator 150 (or at least part of the estimator 150) into a separate device, with the devices being couple via terminals. Also, the ADC 136 and/or DAC 116 may be on separate devices, the demodulator 127 may be integrated with the sampling circuit 130, etc. Note also that the estimator 150 does not necessarily have to provide real-time response as compared to elements such as the predistorter 110, and may be implemented using various approaches, for instance, using a digital coprocessor, a probabilistic inference processor (see e.g., "PROGRAMMABLE PROBABILITY PROCESSING," US Pat. Pub. 2012/0317065, incorporated herein by reference).

In some implementations, the procedures described above for use in the linearization system 100 are implemented in software for controlling a instruction processor (e.g., a controller, as digital signal processor, a general purpose computer processor, etc.). Such software may be stored in a non-transitory machine-readable medium, including in a semiconductor memory or on a computer-readable disk. In some implementations, a computer accessible storage medium includes a database representative of some or all of the system 100. Generally speaking, a computer accessible storage medium may include any non-transitory storage media accessible by a computer during use to provide instructions and/or data to the computer. For example, a computer accessible storage medium may include storage media such as magnetic or optical disks and semiconductor memories. Generally, the database representative of the system may be a database or other data structure which can be read by a program and used, directly or indirectly, to fabricate the hardware comprising the system For example, the database may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist comprises a set of gates which also represent the functionality of the hardware comprising the system 100. The netlist may then be placed and routed to produce a data set describing geometric shapes to be applied to masks. The masks may then be used in various semiconductor fabrication steps to produce a semiconductor circuit or circuits corresponding to the system 100. In other examples, the database may itself be the netlist (with or without the synthesis library) or the data set.

It is to be understood that the foregoing description is intended to illustrate and not to limit the scope of the invention, which is defined by the scope of the appended claims. Other embodiments are within the scope of the following claims.

What is claimed is:

1. A digital predistortion linearizer, comprising:
a pre-distorter to determine a driving signal representative of an input to a plant to achieve a desired output from the plant, wherein the driving signal has a driving signal data rate equal to a product of a driving signal sampling rate and a driving signal precision, and the desired output has a desired output bandwidth;
a digitizer coupled to the second input to process an analog sensor signal to generate a sampled sensor signal, wherein the analog sensor signal is representative of an achieved output from the plant, the digitizer is responsive to components of the analog sensor signal outside the desired output bandwidth in a sensor bandwidth greater than the desired output bandwidth, the sampled sensor signal has a sensor signal precision lower than the driving signal precision, and the sampled sensor signal has a sensor signal data rate smaller than the driving signal data rate; and
an estimator to receive the sampled sensor signal from the digitizer and the driving signal determined by the pre-distorter, and to provide configuration data for configuring the pre-distorter.

2. The digital predistortion linearizer of claim 1, wherein the plant comprises a radio frequency amplifier.

3. The digital predistortion linearizer of claim 1, wherein the digital predistortion linearizer is operatively coupled to the plant.

4. The digital predistortion linearizer of claim 1, further comprising:
a digital to analog converter (DAC) to provide an output signal representative of the driving signal, wherein the output signal comprises an analog signal output from the DAC, and the DAC is to convert the driving signal precision to analog form at the driving signal sampling rate.

5. The digital predistortion linearizer of claim 1, wherein the digitizer is to generate the sampled sensor signal at a sensor signal sampling rate lower than the driving signal sampling rate.

6. The digital predistortion linearizer of claim 1, wherein the digitizer comprises:
a sampling circuit, responsive to signal components of the analog sensor signal outside the desired output bandwidth, to acquire analog samples of the analog sensor signal at a sensor sampling rate insufficient to represent the sensor bandwidth; and
an analog to digital converter (ADC), wherein the ADC is to convert the acquired analog samples to form the sampled sensor signal, and the sampled sensor signal is representative of at least some signal components outside the desired output bandwidth.

7. The digital predistortion linearizer of claim 1, wherein the digitizer comprises a quantizer, a difference element to receive the analog sensor signal and produce a difference between the analog sensor signal and an output of the quantizer, and a filter coupled between the difference element and the quantizer to provide a filtered output of the difference element to the quantizer, and wherein the sampled sensor signal is based on an output of the quantizer.

8. The digital predistortion linearizer of claim 1, wherein the digitizer comprises a subband sampler configurable to quantize a subband within the sensor bandwidth, the subband has a bandwidth smaller than the sensor bandwidth, and the digitizer is to provide sampled sensor values at a sampling rate sufficient to represent the subband bandwidth.

9. The digital predistortion linearizer of claim 8, wherein the estimator is to use sampled sensor values from a plurality of subbands to provide the configuration data for the pre-distorter.

10. The digital predistortion linearizer of claim 9, wherein the sampled sensor signals from the plurality of subbands are each generated in respective ones of an associated plurality of successive time intervals.

11. The digital predistortion linearizer of claim 1, wherein the digital predistortion linearizer is integrated into a single integrated circuit device.

12. The digital predistortion linearizer of claim 11, further comprising a controller and a memory to store instructions and data for configuring the digital predistortion linearizer.

13. The digital predistortion linearizer of claim 1, wherein the digitizer is to provide at lease some of the samples of the sampled sensor signal at non-uniform time intervals.

14. The digital predistortion linearizer of claim 1, wherein the sampled sensor signal is provided in accordance with a Delta-Sigma conversion approach.

15. A method for linearization of a plant, comprising:
determining, according to pre-distorter configuration data, a driving signal representative of an input to a plant to achieve a desired output from the plant, wherein the driving signal has a driving signal data rate equal to a product of a driving signal sampling rate and a driving signal precision, and the desired output has a desired output bandwidth;
processing a sensor input signal to generate sampled sensor data, wherein the sensor input signal is representative of an achieved output from the plant, said processing is responsive to components of the sensor input signal outside the desired output bandwidth in a sensor bandwidth greater than the desired output bandwidth, the sampled sensor data has a sensor signal data rate smaller than the driving signal data rate, and the sampled sensor data has a sensor signal precision less than the driving signal precision; and
generating the pre-distorter configuration data from the sampled sensor data and the driving signal.

16. The method of claim 15, wherein processing the sensor input signal comprises generating the sampled sensor data at a sensor signal sampling rate lower than the driving signal sampling rate.

17. The method of claim 16 wherein generating the sampled sensor data comprises sampling using analog circuitry suitable for processing of the sensor signal at the sensor bandwidth and converting the sensor signal to form the digital outputs at a conversion rate lower than the sensor bandwidth.

18. The method of claim 16 wherein generating the sampled sensor data comprises, in a succession of time intervals, providing digital outputs to represent different subbands smaller than the sensor bandwidth, and wherein generating the pre-distorter configuration data comprises combining the digital outputs associated with a plurality of the subbands.

19. The method of claim 15, wherein the sensor signal precision is smaller than one-half the driving signal precision.

20. The method of claim 15, wherein generating the sampled sensor data comprises applying a Delta-Sigma ($\Delta\Sigma$) conversion approach to the sensor input signal.

21. The method of claim 15, wherein at least some samples of the sampled sensor signal are spaced apart by non-uniform time intervals.

22. The method of claim 15, further comprising:
providing an output signal representative of the driving signal to the plant, wherein providing the output signal comprises converting the driving signal using a digital to analog converter (DAC) at the driving signal sampling rate and the driving signal precision.

23. A linearization system, comprising:
a signal sampling apparatus, comprising:
a sampling circuit to generate a sampled signal representative of an output of a plant, wherein the sampling circuit is to generate the sampled signal at a sampling rate rate smaller than a sampling rate sufficient to represent the output of the plant, and
an analog to digital converter (ADC), coupled to the sampling circuit, to convert the sampled signal into a digital sampled signal;
an estimator, coupled to the signal sampling apparatus, to receive the digital sampled signal, to receive samples of a driving signal to the plant, and to determine data characterizing non-linear characteristics of the plant, wherein the driving signal has a driving signal signal data rate equal to a product of a driving signal sampling rate and a driving signal precision; and
a pre-distorter to receive the data characterizing the non-linear characteristics and a desired output signal, and to provide the driving signal to the plant based on the non-linear characteristics and the desired output signal;
wherein the ADC is to convert the sampled signal into a digital sampled signal at a precision lower than the driving signal precision.

24. The linearization system of claim 23, wherein the pre-distorter includes:
an output predictor to receive the data characterizing the non-linear characteristics and samples of the driving signal, and to determine estimated output samples of the amplifier; and
an input estimator to receive samples of the desired output signal, and to determine the driving signal for the plant.

25. The linearization system of claim 23, wherein the plant comprises a power amplifier.

26. The linearization system of claim 25, wherein the plant comprises a modulator to receive the driving signal to the plant, and to provide a modulated radio frequency signal to the power amplifier.

27. The linearization system of claim 26, wherein the plant further comprises a demodulator to provide the output of the plant to the signal sampling apparatus as a demodulation of an output of the power amplifier.

28. The linearization system of claim 26, wherein the output of the plant comprises a modulated output of the power amplifier, and the signal sampling apparatus is to perform a direct conversion of the modulated output of the power amplifier.

29. The method of claim 26, wherein the output of the plant comprises multiple components, and the ADC is to be shared to convert samples of said components at different times.

30. The linearization system of claim 29, wherein the multiple components comprise quadrature components.

31. The linearization system of claim 23, wherein the digital sampled signal is generated in accordance with a Delta-Sigma conversion approach.

32. The linearization system of claim 23, wherein at least some samples of the digital sampled signal are spaced apart by non-uniform time intervals.

* * * * *